(12) United States Patent
Chen et al.

(10) Patent No.: US 12,283,935 B2
(45) Date of Patent: Apr. 22, 2025

(54) RADIO FREQUENCY APPARATUS AND INDUCTANCE DEVICE THEREOF

(71) Applicant: REALTEK SEMICONDUCTOR CORP., Hsinchu (TW)

(72) Inventors: Hung-Han Chen, Hsinchu (TW);
Hsiao-Tsung Yen, Hsinchu (TW);
Jian-You Chen, Hsinchu (TW);
Po-Chih Wang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 426 days.

(21) Appl. No.: 17/886,160

(22) Filed: Aug. 11, 2022

(65) Prior Publication Data
US 2023/0050926 A1 Feb. 16, 2023

(30) Foreign Application Priority Data
Aug. 13, 2021 (TW) .................. 110130031

(51) Int. Cl.
| | |
|---|---|
| *H03H 7/01* | (2006.01) |
| *H01F 27/28* | (2006.01) |
| *H01F 27/29* | (2006.01) |
| *H03F 3/21* | (2006.01) |
| *H03F 3/45* | (2006.01) |
| *H03H 1/00* | (2006.01) |
| *H04B 1/04* | (2006.01) |

(52) U.S. Cl.
CPC ....... *H03H 7/0115* (2013.01); *H01F 27/2804* (2013.01); *H01F 27/29* (2013.01); *H03F 3/21* (2013.01); *H03F 3/45* (2013.01); *H03F 3/45479* (2013.01); *H04B 1/04* (2013.01); *H03H 1/0007* (2013.01)

(58) Field of Classification Search
CPC ......... H03F 3/45479; H03F 3/45; H03H 7/09; H03H 1/0007; H03H 7/0115
USPC ................................. 333/175, 177, 181, 185
See application file for complete search history.

(56) References Cited

U.S. PATENT DOCUMENTS

| | | | |
|---|---|---|---|
| 7,629,860 B2 * | 12/2009 | Liu ..................... | H01F 17/0013 333/25 |
| 11,095,324 B2 | 8/2021 | Chen et al. | |
| 2006/0141978 A1 * | 6/2006 | Liu ..................... | H03H 7/1766 455/333 |

(Continued)

*Primary Examiner* — Rakesh B Patel
(74) *Attorney, Agent, or Firm* — Birch, Stewart, Kolasch & Birch, LLP

(57) ABSTRACT

A radio frequency apparatus includes a power amplifier circuit, a signal coupling circuit, an extraction circuit, and a harmonic filter circuit. The power amplifier circuit is configured to amplify a differential signal to output a to-be-filtered signal. The signal coupling circuit includes a primary side inductor and a secondary side inductor. The signal coupling circuit is configured to convert the to-be-filtered signal received by the primary side inductor into a single-ended signal outputted from the secondary side inductor. The extraction circuit has a center tap. The extraction circuit is configured to inductively couple to the primary side inductor and output a common mode signal from the center tap. The harmonic filter circuit is configured to perform a harmonic filtering on the single-ended signal according to the common mode signal, such that the secondary side inductor of the signal coupling circuit outputs a filtered signal.

20 Claims, 10 Drawing Sheets

(56) References Cited

U.S. PATENT DOCUMENTS

2011/0241163 A1* 10/2011 Liu .......................... H03H 7/09
                                                         257/532

* cited by examiner

RADIO FREQUENCY APPARATUS AND INDUCTANCE DEVICE THEREOF

CROSS-REFERENCE TO RELATED APPLICATION

This non-provisional application claims priority under 35 U.S.C. § 119 (a) to patent application No. 110130031 filed in Taiwan, R.O.C. on Aug. 13, 2021, the entire contents of which are hereby incorporated by reference.

BACKGROUND

Technical Field

The present application relates to a technology of communication transmission, especially a radio frequency apparatus and inductance device thereof.

Related Art

Second harmonic, third harmonic, etc. are generated during the operation of radio frequency (RF) circuit, and the aforementioned harmonics will make an undesirable effect on other circuits. Take a circuit applied a 2.4 GHz Wi-Fi for example, its second harmonic will generate a signal with 4.8 GHz. The 4.8 GHz is close to 5 GHz. Therefore, the second harmonic will affect a circuit whose working frequency is 5 GHz (e.g., a circuit applied a 5 GHz Wi-Fi).

The general way to solve the aforementioned harmonics' influence on the circuit is to provide a filter outside the radio frequency circuit to filter the aforementioned harmonics. However, the filter provided outside the radio frequency circuit will affect the performance of the radio frequency circuit, occupy additional circuit placement space and produce additional costs.

SUMMARY

In view of the above, the present application provides a radio frequency apparatus and an inductance device thereof. According to some embodiments, with the radio frequency apparatus and the inductance device thereof in the present application, the efficiency to filter harmonics can be improved, the occupied circuit (or chip) space can be reduced and the symmetry of the circuit (or chip) can be improved. For example, integrate the main elements of harmonic filter into some existing elements in the radio frequency apparatus to achieve at least one of aforementioned effects.

According to some embodiments, the radio frequency apparatus includes a power amplifier circuit, a signal coupling circuit, an extraction circuit and a harmonic filter circuit. The power amplifier circuit is configured to amplify a differential signal to output a to-be filtered signal. The signal coupling circuit includes a primary side inductor and a secondary side inductor. The signal coupling circuit is configured to receive the to-be filtered signal through the primary side inductor and to output a single-ended signal from the secondary side inductor. The extraction circuit has a center tap. The extraction circuit is configured to be coupled with the primary side inductor and to output a common mode signal from the center tap. The harmonic filter circuit is configured to perform a harmonic filtering on the single-ended signal according to the common mode signal, such that the secondary side inductor of the signal coupling circuit outputs a filtered signal.

According to some embodiments, the inductance device comprises a first conductive layer pattern in coiled, a second conductive layer pattern in coiled and a capacitor. The first conductive layer pattern forms a primary side inductor and a secondary side inductor of a signal coupling circuit. The signal coupling circuit is configured to convert a to-be-filtered signal from the primary side inductor to a single-ended signal of the secondary side inductor. The second conductive layer pattern comprises a first routing, a second routing and a connecting component. One end of the first routing is coupled to a first node. One end of the second routing is coupled to a second node. The connecting component is coupled between another end of the first routing and another end of the second routing and has a center tap. The first conductive layer pattern and the second conductive layer pattern are arranged with respect to a central axis in a symmetrical state, and the center tap is located on the central axis. The capacitor is coupled between the first node and the second node to form an extraction circuit and a resonant circuit of a harmonic filter circuit with the second conductive layer pattern. The extraction circuit is configured to couple with the primary side inductor and to output a common mode signal from the center tap. The harmonic filter circuit is configured to perform a harmonic filtering on the single-ended signal according to the common mode signal, such that the secondary side inductor of the signal coupling circuit outputs a filtered signal.

According to some embodiments, the inductance device comprises a first conductive layer pattern in coiled, a second conductive layer pattern in coiled, a first capacitor and a third conductive layer pattern in coiled. The first conductive layer pattern forms a primary side inductor and a secondary side inductor of a signal coupling circuit. The signal coupling circuit is configured to convert a to-be-filtered signal from the primary side inductor to a single-ended signal of the secondary side inductor. The second conductive layer pattern forms a resonant circuit of a harmonic filter circuit. The second conductive layer pattern comprises a first routing, a second routing and a connecting component. One end of the first routing is coupled to a first node. One end of the second routing is coupled to a second node. The connecting component is coupled between another end of the first routing and another end of the second routing. The first capacitor is coupled between the first node and the second node. The third conductive layer pattern has a center tap. Two ends of the third conductive layer pattern are respectively coupled to a second capacitor and a third capacitor to form an extraction circuit. The first conductive layer pattern, the second conductive layer pattern and the third conductive layer pattern are arranged with respect to a central axis in a symmetrical state. The center tap is located on the central axis. The extraction circuit is configured to be coupled with the primary side inductor and to output a common mode signal from the center tap. The harmonic filter circuit is configured to perform a harmonic filtering on the single-ended signal according to the common mode signal, such that the secondary side inductor of the signal coupling circuit outputs a filtered signal.

In sum, according to some embodiments of the present application, the radio frequency apparatus and the inductance device thereof eliminate harmonic through a signal with the same frequency as the harmonic and with the phase inverse to the harmonic, so as to reduce the harmonic of output signal without affecting the fundamental frequency of the output signal, and further to reduce the undesirable effects of the radio frequency apparatus and the inductance device thereof on other circuits (such as devices operating at other frequency bands). In some embodiments, the harmonic filter for filtering harmonics is disposed inside the radio frequency apparatus and the inductance device thereof. Therefore, it reduces the exposure to some external interference factors, and it can avoid affecting the performance of the circuit itself in the radio frequency apparatus or avoid increasing additional costs.

BRIEF DESCRIPTION OF THE DRAWINGS

The disclosure will become more fully understood from the detailed description given herein below for illustration only, and thus not limitative of the disclosure, wherein.

DETAILED DESCRIPTION

The ordinal terms such as "first", "second", etc., described in this disclosure are configured to distinguish the referred elements, not to order or limit the differences of the referred elements, and not to limit the scope of the present application. Furthermore, the used terms "couple to" or "connect to" and the like are referred to two or more elements directly physical or electrical contact with each other, or indirectly physical or electrical contact with each other. For example, if it is described that a first device is coupled to a second device, it represents that the first device could be electrically connected to the second device directly or electrically connected to the second device indirectly through other devices or connecting means. Moreover, the used term "coupling" is referred to inductive coupling.

Figure 1:
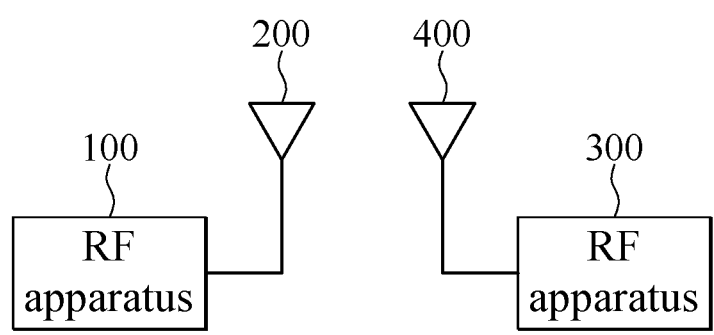
FIG. 1 illustrates a schematic block diagram of two radio frequency apparatus according to some embodiments of the present application.

Refer to FIG. 1. FIG. 1 illustrates a schematic diagram of radio frequency apparatus 100 and 300 according to some embodiments of the present application. The radio frequency apparatus 100 is coupled to an antenna 200. When the radio frequency apparatus 100 is working, it performs communication (signal) transmission with another radio frequency apparatus 300 through antenna 200. For example, a radio-frequency transmission circuit (not shown) in the radio frequency apparatus 100 outputs a signal (e.g., radio frequency signal) through the antenna 200, and a radio-frequency transmission circuit (not shown) in the radio frequency apparatus 300 receives the signal from the radio frequency apparatus 100 through antenna 400.

Figure 2:
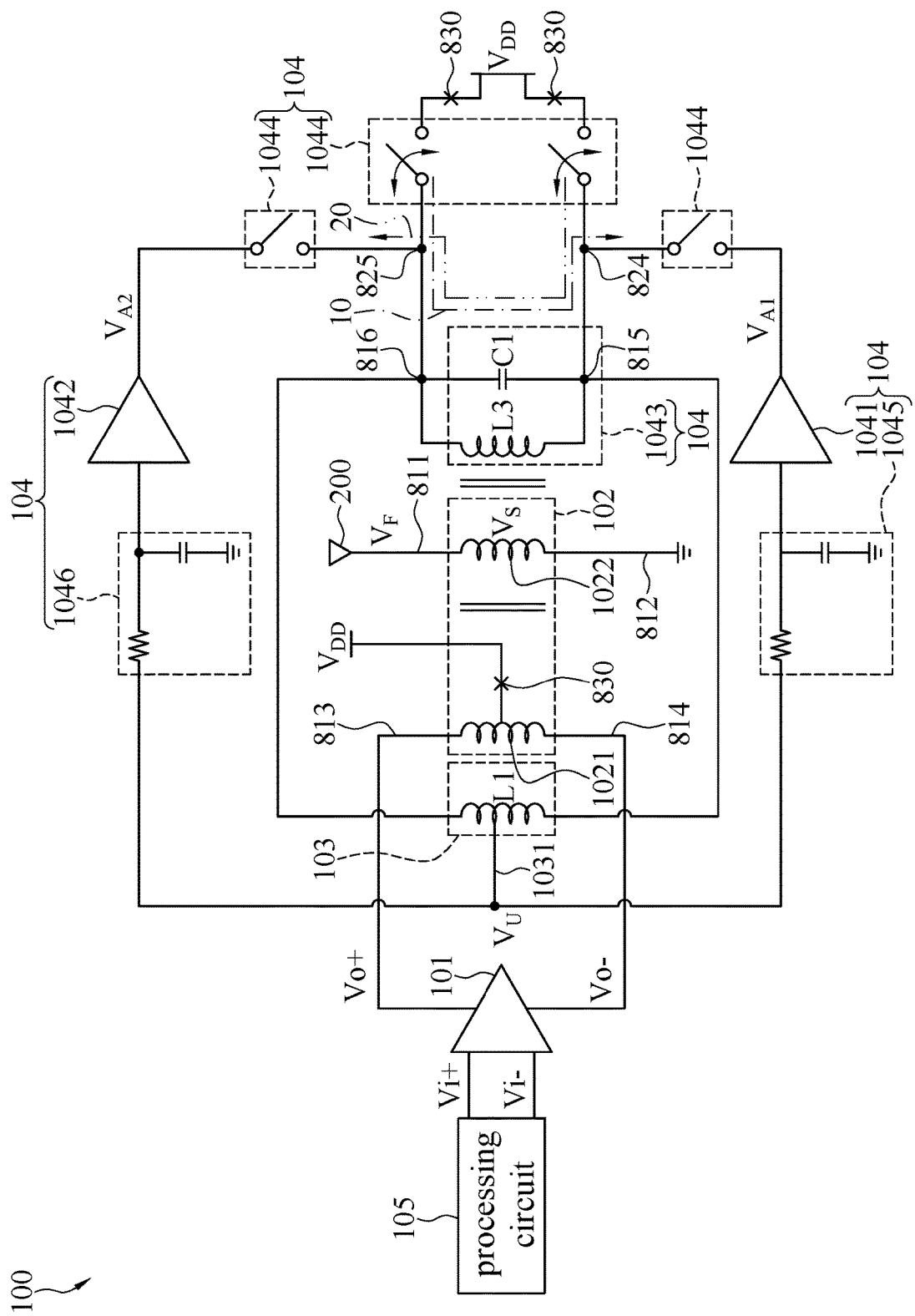
FIG. 2 illustrates a schematic block diagram of a radio frequency apparatus of a first embodiment of the present application.

Refer to FIG. 2. FIG. 2 illustrates a schematic block diagram of radio frequency apparatus 100 of a first embodiment of the present application. The radio frequency apparatus 100 includes a power amplifier circuit 101, a signal coupling circuit 102, an extraction circuit 103 and a harmonic filter circuit 104. The power amplifier circuit 101 is coupled to the signal coupling circuit 102. The harmonic filter circuit 104 is coupled to the extraction circuit 103.

In some embodiments, the radio frequency apparatus 100 further includes a processing circuit 105. The processing circuit is configured to process the data of the radio frequency apparatus 100, and to convert a data to be transmitted to the outside of the radio frequency apparatus 100 (e.g., radio frequency apparatus 300) into differential signals Vi+ and Vi−. The processing circuit 105 may be an operational circuit such as embedded controller, central processing unit, microprocessor, application-specific integrated circuit, SoC (System on Chip) or the like.

Figure 3:
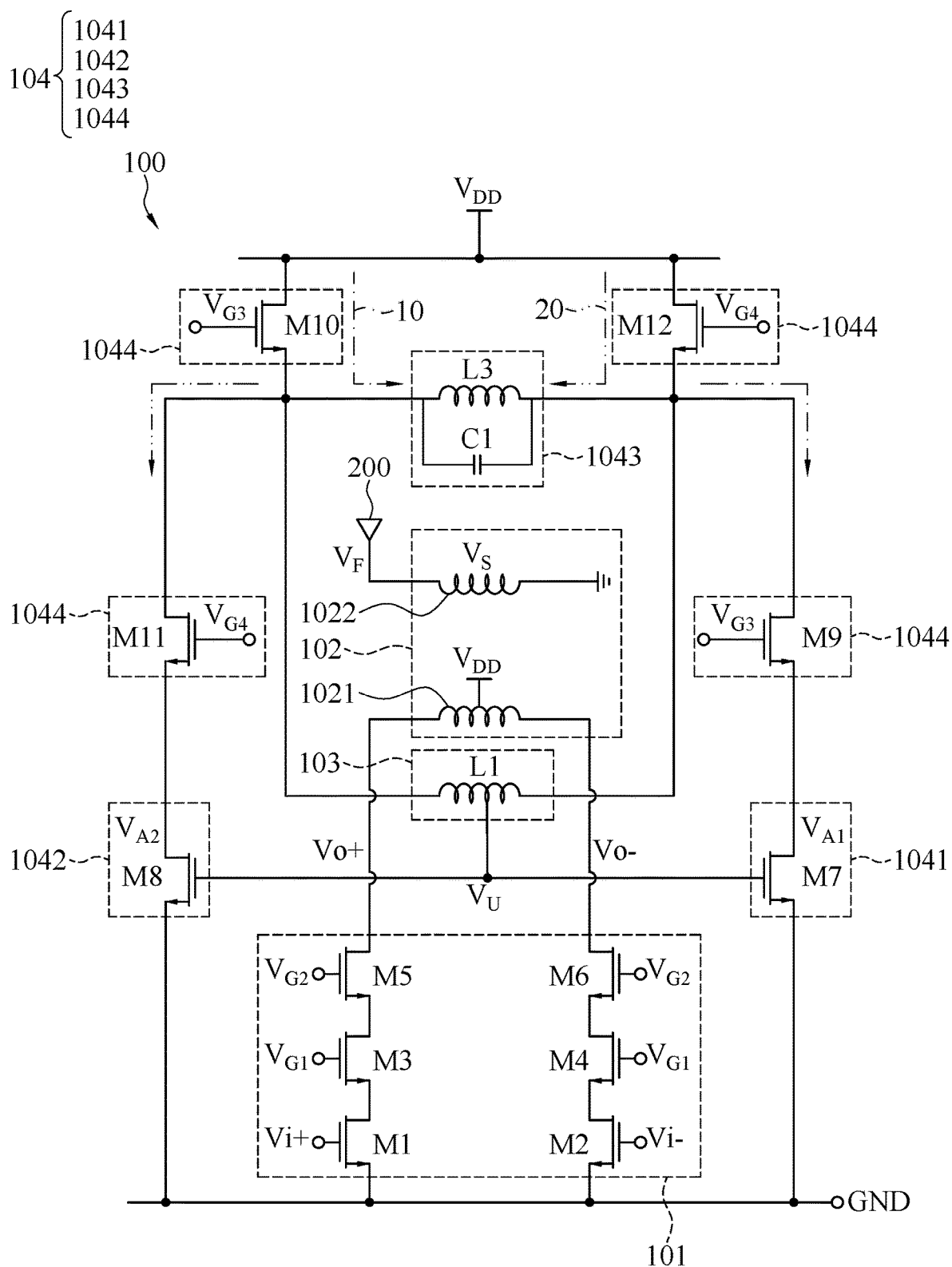
FIG. 3 illustrates a detailed circuit diagram of a part of the radio frequency apparatus of the first embodiment of the present application.

Refer to FIG. 2 and FIG. 3. FIG. 3 illustrates a detailed circuit diagram of a part of the radio frequency apparatus 100 of the first embodiment of the present application. The power amplifier circuit 101 is configured to amplify the differential signals Vi+ and Vi− to output to-be-filtered signals Vo+ and Vo−. In some embodiments, the power amplifier circuit 101 includes at least a pair of common source transistors (common source transistors M1 to M6 as shown in FIG. 3). Herein, FIG. 3 uses three pairs of common source transistors M1-M6 as an example. However, it is not limited to only three pairs. The number of pairs of common source transistors could be less than or more than three pairs depending on the magnitude of the gain to be performed on signal. Herein, three pairs of common source transistors M1-M6 are used for explanation. For example, the common source transistors M1-M6 could be NMOS transistors and are connected in series (e.g., the sources of the common source transistors M3 and M4 are coupled to the drains of the common source transistors M1 and M2, and the drains of the common source transistors M3 and M4 are coupled to the sources of the common source transistors M5 and M6), the drains of the common source transistors M5 and M6 are coupled to the signal coupling circuit 102 (two input terminals 813 and 814 of the signal coupling circuit 102), the sources of the common source transistors M1 and M2 are commonly coupled to a ground voltage GND, and the gates of the common source transistors M1 and M2 are respectively coupled to two output terminals of the processing circuit 105 to obtain the differential signals Vi+ and Vi−. After the common source transistors M1-M6 perform gaining on the differential signals Vi+ and Vi−, the drains of the common source transistors M5 and M6 output the to-be-filtered signals Vo+ and Vo− to the signal coupling circuit 102. In some embodiments, the common source transistors M3-M6 can adjust the magnitude of the provided gain according to the bias voltages $V_{G1}$ and $V_{G2}$ of their gates (e.g., an increase in the bias voltages $V_{G1}$ and $V_{G2}$ can provide larger gain. On the contrary, it provides a smaller gain). The bias voltages $V_{G1}$ and $V_{G2}$ could be obtained from the processing circuit 105.

The signal coupling circuit 102 includes a primary side inductor 1021 and a secondary side inductor 1022. The signal coupling circuit 102 may be a Balun (balanced to unbalanced). The signal coupling circuit 102 is configured to convert the to-be filtered signals Vo+ and Vo− received at the primary side inductor 1021 into a single-ended signal Vs outputted from the secondary side inductor 1022. Specifically, one terminal of the secondary side inductor 1022 (hereinafter referred to as secondary side ground terminal 812) is coupled to the ground voltage GND, and another terminal (hereinafter referred to as output terminal 811) is coupled to the antenna 200. Two terminals of the primary side inductor 1021 (hereinafter referred to as two input terminals 813 and 814 of the signal coupling circuit 102) are respectively coupled to two output terminal of the power amplifier circuit 101 (i.e., the drains of the common source transistors M5 and M6) to receive the to-be filtered signals Vo+ and Vo−. The primary side inductor 1021 is coupled with the secondary side inductor 1022 to convert the to-be filtered signals Vo+ and Vo− into the single-ended signal Vs.

The extraction circuit 103 has a center tap 1031. The extraction circuit 103 is configured to be coupled with the primary side inductor 1021 and to output a common mode signal $V_U$ from the center tap 1031. Specifically, the extraction circuit 103 is coupled with the primary side inductor 1021 to obtain the to-be filtered signals Vo+ and Vo−, and outputs the common mode signal $V_U$ of the power amplifier circuit 101 from the center tap 1031 according to the to-be filtered signals Vo+ and Vo−. A voltage value of the common mode signal $V_U$ can be a value obtained by adding the to-be filtered signals Vo+ and Vo− and then dividing by two. In some embodiments, the common mode signal $V_U$ could be mainly composed of harmonics in the to-be filtered signals Vo+ and Vo−. The aforementioned harmonics may be harmonics such as second harmonic, third harmonic, etc., of the fundamental frequency (the main operating frequency of the radio frequency apparatus 100). By way of illustration, if the fundamental frequency is 2.4 GHz, the second harmonic is 4.8 GHz, and the third harmonic is 7.2 GHz. For example, the extraction circuit 103 has a low-frequency filtering function (e.g., to achieve this function by a capacitor), and performs the low-frequency filtering on the to-be filtered signals Vo+ and Vo−(e.g., suppress wave of the fundamental frequency in the to-be filtered signals Vo+ and Vo−) to retain the harmonics whose frequency is higher than the wave of the fundamental frequency (fundamental frequency wave), thereby forms the common mode signal $V_U$.

The harmonic filter circuit 104 is configured to perform a harmonic filtering on the single-ended signal Vs at the secondary side inductor 1022 according to the common mode signal $V_U$, such that the secondary side inductor 1022 of the signal coupling circuit 102 outputs a filtered signal $V_F$ (i.e., the aforementioned radio frequency signal) through the antenna 200 to the outside of the radio frequency apparatus 100 (e.g., radio frequency apparatus 300). Wherein, the harmonic filter circuit 104 is coupled to the center tap 1031 of the extraction circuit 103 to obtain the common mode signal $V_U$. The harmonic filter circuit 104 may be a high frequency filter circuit or a band-rejection filter circuit, and the harmonic filtering may be high frequency filtering or band-rejection filtering. Since the single-ended signal Vs is obtained by the conversion of the signal coupling circuit 102, the to-be filtered signals Vo+ and Vo− and the single-ended signal Vs have similar fundamental frequency waves and similar harmonics. The harmonic filtering performed by the harmonic filter circuit 104 preserves the fundamental frequency wave in the single-ended signal Vs, and suppresses the harmonics such as second harmonic, third harmonic, etc., of the fundamental frequency wave in the single-ended signal Vs to form the filtered signal $V_F$. For example, the harmonic filter circuit 104 generates a harmonic voltage signal whose is inverse to the phase of the harmonic in the single-ended signal Vs (e.g., a phase of harmonic of the single-ended signal Vs is 180 degrees, then the phase of the harmonic voltage signal is zero degrees; or the phase of harmonic of the single-ended signal Vs is zero degrees, then the phase of the harmonic voltage signal is 180 degrees). Therefore, the harmonic filter circuit 104 eliminates the harmonic in the single-ended signal Vs to form the filtered signal $V_F$ by coupling the harmonic voltage signal to the single-ended signal Vs. In some embodiments, the harmonic voltage signal has the same voltage level and the same frequency as the harmonic in the single-ended signal Vs.

Figure 4:
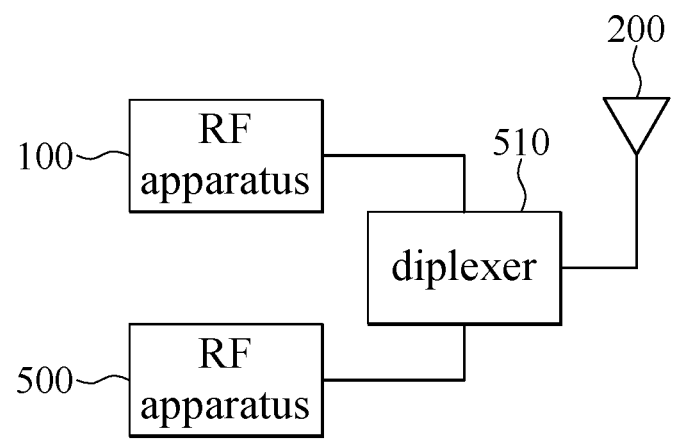
FIG. 4 illustrates a schematic block diagram of two radio frequency apparatus according to some embodiments of the present application.

Refer to FIG. 4. FIG. 4 illustrates a schematic block diagram of two radio frequency apparatus 100 and 500 according to some embodiments of the present application. Take the main operating frequency of the radio frequency apparatus 100 is 2.4 GHz and the main operating frequency of the radio frequency apparatus 500 is 5 GHz as an example, the radio frequency apparatus 100 and the radio frequency apparatus 500 respectively operate in different frequency band. Therefore, they can share the same antenna 200 through a diplexer 510. If the signal (e.g., radio frequency signal) output by the radio frequency apparatus 100 through the antenna 200 is not subjected to the process of harmonic filtering, it will interfere with the signal generated by the radio frequency apparatus 500 during operation. For example, the second harmonic generated by the radio frequency apparatus 100 is 4.8 GHz. Since 4.8 GHz is close to 5 GHZ, if the second harmonic is not filtered out, it will interfere with the operation of the radio frequency apparatus 500. As a result, according to the content of the aforementioned embodiments of the present application, the radio frequency apparatus 100 solve this problem by effectively filtering out the harmonics generated by itself (e.g., the filtered signal $V_F$ outputted by the radio frequency apparatus 100 will not affect the operation of the radio frequency apparatus 500 for the harmonic has been filtered out).

In some embodiments, as shown in FIG. 2, the harmonic filter circuit 104 includes a first amplifier circuit 1041, a second amplifier circuit 1042 and a resonant circuit 1043. The first amplifier circuit 1041 and the second amplifier circuit 1042 are respectively coupled between the center tap 1031 of the extraction circuit 103 and the resonant circuit 1043. The first amplifier circuit 1041 is configured to amplify the common mode signal $V_U$ under a first phase to output a first amplified signal $V_{A1}$. The second amplifier circuit 1042 is configured to amplify the common mode signal $V_U$ under a second phase to output a second amplified signal $V_{A2}$. The resonant circuit 1043 is configured to couple the single-ended signal Vs when the common mode signal $V_U$ is under the first phase according to the first amplified signal $V_{A1}$, and to couple the single-ended signal Vs when the common mode signal $V_U$ is under the second phase according to the second amplified signal $V_{A2}$, so as to perform harmonic filtering on the single-ended signal Vs.

Furthermore, in order to eliminate the harmonics in different phases, the common mode signal $V_U$ in different phases is amplified by using different paths and elements on the paths to respectively generate a harmonic current inverse to the phases of the harmonics. For example, since the single-ended signal Vs is an AC signal, the phases of harmonics in the single-ended signal Vs is zero degrees in some conditions. At this time, the phase (first phase) of the common mode signal $V_U$ is zero degrees, and the common mode signal $V_U$ at this time is amplified through the first amplifier circuit 1041 located on a first filter path 10 so as to output a first amplified signal $V_{A1}$ inverse to the first phase (i.e., a harmonic current signal with a phase of 180 degrees). The resonant circuit 1043 generates a harmonic voltage signal inverse to the first phase (i.e., a harmonic voltage with a phase of 180 degrees) according to the first amplified signal $V_{A1}$, and couples this harmonic voltage with the single-ended signal Vs, thereby eliminating the harmonics whose phase is zero degrees in the single-ended signal Vs. Similarly, the phases of harmonics in the single-ended signal Vs is 180 degrees in other conditions. At this time, the phase (second phase) of the common mode signal $V_U$ is 180 degrees, the resonant circuit 1043 obtains a second amplified signal $V_{A2}$ inverse to the second phase (i.e., a harmonic current signal with a phase of 0 degrees) through the second amplifier circuit 1042 on a second filter path 20, and generates a harmonic voltage inverse to the second phase (i.e., a harmonic voltage signal with a phase of 0 degrees) according to the second amplified signal $V_{A2}$, so as to eliminate the harmonics whose phase is 180 degrees in the single-ended signal Vs.

In some embodiments, as shown in FIG. 3, the first amplifier circuit 1041 and the second amplifier circuit 1042 can respectively include a common source transistor M7 and a common source transistor M8. The drains of the common source transistors M7 and M8 are respectively coupled to different terminals of the resonant circuit 1043, and the gates of the common source transistors M7 and M8 are coupled to the center tap 1031 of the extraction circuit 103 to respectively obtain a common mode signal $V_U$ under a first phase and a common mode signal $V_U$ under a second phase. When the common mode signal $V_U$ is under the first phase, the common source transistor M7 amplifies the common mode signal $V_U$ at this time to output a first amplified signal $V_{A1}$ through its drain to the resonant circuit 1043. When the common mode signal $V_U$ is under the second phase, the common source transistor M8 amplifies the common mode signal $V_U$ at this time to output a second amplified signal $V_{A2}$ through its drain to the resonant circuit 1043. The common source transistors M7 and M8 may be NMOS transistors.

In some embodiments, as shown in FIG. 3, the resonant circuit 1043 may be an inductor-capacitor parallel resonant circuit (L-C parallel resonant circuit). For example, the resonant circuit 1043 includes at least one inductor L3 and a capacitor (hereinafter referred to as a first capacitor C1) connected in parallel to the inductor L3 to perform harmonic filtering one the single-ended signal Vs. Specifically, by configuring the values of the inductor L3 and the first capacitor C1, a resonant frequency formed by the inductor L3 and the first capacitor C1 is the same as the frequency of the harmonic of the single-ended signal Vs, so as to suppress the waves of frequency of other non-harmonics in the first amplified signal $V_{A1}$ and the second amplified signal $V_{A2}$. Thereby merely the harmonics of the single-ended signal Vs are eliminated without influencing the fundamental frequency wave of the single-ended signal Vs after coupling the harmonic voltage signal to the single-ended signal Vs. In some embodiments, the resonant circuit 1043 can perform second harmonic filtering. In other words, the aforementioned resonant frequency can be twice the fundamental frequency.

In some embodiments, as shown in FIG. 2, the harmonic filter circuit 104 further includes a switching circuit 1044. The switching circuit 1044 is coupled between the first amplifier circuit 1041, the second amplifier circuit 1042 and the resonant circuit 1043. The switching circuit 1044 is configured to switch harmonic filter paths (the first filter path 10 and the second filter path 20) of the radio frequency apparatus 100. The first filter path 10 is shown by a single-dotted chain line in the figure. The second filter path 20 is shown by a double-dotted chain line in the figure. When the common mode signal $V_U$ is under the first phase, the switching circuit 1044 conducts the coupling between the first amplifier circuit 1041 and the resonant circuit 1043 to form the first filter path 10 and enables the resonant circuit 1043 to perform harmonic filtering by using the first amplified signal $V_{A1}$. When the common mode signal $V_U$ is under the second phase, the switching circuit 1044 conducts the coupling between the second amplifier circuit 1042 and the resonant circuit 1043 to form the second filter path 20 and enables the resonant circuit 1043 to perform harmonic filtering by using the second amplified signal $V_{A2}$.

In some embodiments, as shown in FIG. 3, the switching circuit 1044 may be realized by transistors. For example, the switching circuit 1044 includes two pairs of common source transistors M9-M12. The first pair of common source transistors M9 and M10 is configured to control whether to conduct the coupling between the first amplifier circuit 1041 and the resonant circuit 1043 to determine whether to form the first filter path 10. The second pair of common source transistors M11 and M12 is configured to control whether to conduct the coupling between the second amplifier circuit 1042 and the resonant circuit 1043 to determine whether to form the second filter path 20. By way of illustration, the gates of the common source transistors M9 and M10 are coupled to a bias voltage $V_{G3}$, the gates of the common source transistors M11 and M12 are coupled to a bias voltage $V_{G4}$, the drains of the common source transistors M10 and M12 are coupled to a system voltage VDD, the source of the common source transistor M9 is coupled to the first amplifier circuit 1041, the source of the common source transistor M11 is coupled to the second amplifier circuit 1042, the source of the common source transistor M10 and the drain of the common source transistor M11 are coupled to one terminal of the resonant circuit 1043, and the source of the common source transistor M12 and the drain of the common source transistor M9 are coupled to another terminal of the resonant circuit 1043. By that means, when the common source transistors M9 and M10 are conductive, the first filter path 10 is formed, such that the resonant circuit 1043 can obtain the first amplified signal $V_{A1}$ from the first amplifier circuit 1041. When the common source transistors M11 and M12 are conductive, the second filter path 20 is formed, such that the resonant circuit 1043 can obtain the second amplified signal $V_{A2}$ from the second amplifier circuit 1042. The system voltage VDD may be a power source for supplying power to the elements in the radio frequency apparatus 100. The common source transistors M9-12 may be NMOS transistors.

In the aforementioned embodiment, the potential of the bias voltages $V_{G3}$ and $V_{G4}$ may be opposite to each other, such that when one pair of the two pairs of common source transistors M9-12 is conductive, the other pair is non-conductive. For example, when the common mode signal $V_U$ is under the first phase, the bias voltage $V_{G3}$ is at a high potential, the common source transistors M9 and M10 are conductive, and the bias voltage $V_{G4}$ at this time is at a low potential to make the common source transistors M11 and M12 to be non-conductive. On the contrary (e.g., when the common mode signal $V_U$ is under the second phase), the common source transistors M9 and M10 are non-conductive, and the common source transistors M11 and M12 are conductive.

In some embodiments, as shown in FIG. 2, the harmonic filter circuit 104 further includes two matching circuits 1045 and 1046. The matching circuit 1045 is coupled between the center tap 1031 and the first amplifier circuit 1041, and the matching circuit 1046 is coupled between the center tap 1031 and the second amplifier circuit 1042. The matching circuit 1045 is located on the first filter path 10, and the matching circuit 1046 is located on the second filter path 20. The matching circuits 1045 and 1046 are respectively configured to perform a phase and impedance matching on the common mode signal $V_U$ under the first phase and on the common mode signal $V_U$ under the second phase, so as to output the common mode signals $V_U$ matched in phase and impedance to the first amplifier circuit 1041 and the second amplifier circuit 1042. By that means, the common mode signals $V_U$ matched in phase and impedance can be matched with the first amplifier circuit 1041, the second amplifier circuit 1042, and other elements in the radio frequency apparatus 100 (e.g., resonant circuit 1043).

Refer to FIG. 2 and FIG. 3. In the first embodiment, the extraction circuit 103 is an inductor L1. Two terminals of the inductor L1 are coupled to the resonant circuit 1043 of the harmonic filter circuit 104 to form a single loop with the resonant circuit 1043 (e.g., the inductor L1 is in parallel with the resonant circuit 1043, or the inductor L1 is in series with the resonant circuit 1043). In this way, the possibility of being interfered by signals from other elements in the radio frequency apparatus 100 is reduced. Since the inductor L1 and the resonant circuit 1043 form a single loop, a resonant frequency is formed by the inductor L1 and the resonant circuit 1043, and the resonant circuit 1043 performs the harmonic filtering according to this resonant frequency. In some embodiments, the resonant circuit 1043 can perform second harmonic filtering. Therefore, the resonant frequency formed by the inductor L1 and the resonant circuit 1043 can be twice the frequency of the fundamental frequency wave (fundamental frequency) in the single-ended signal Vs. Since the fundamental frequency of the primary side inductor 1021 (the main operating frequency of the radio frequency apparatus 100) is corresponded to the frequency of the fundamental frequency wave of the single-ended signal Vs, in other words, the resonant frequency formed by the inductor L1 and the resonant circuit 1043 is twice the fundamental frequency of the primary side inductor 1021. In some embodiments, the inductor L1 and the resonant circuit 1043 form an inductor-capacitor parallel resonant circuit (e.g., the inductor L1, the inductor L3 and the first capacitor C1 are connected in parallel). In some embodiments, the center tap 1031 of the extraction circuit 103 is located on the inductor L1 (specifically, on the center point of the inductor L1).

Figure 5:
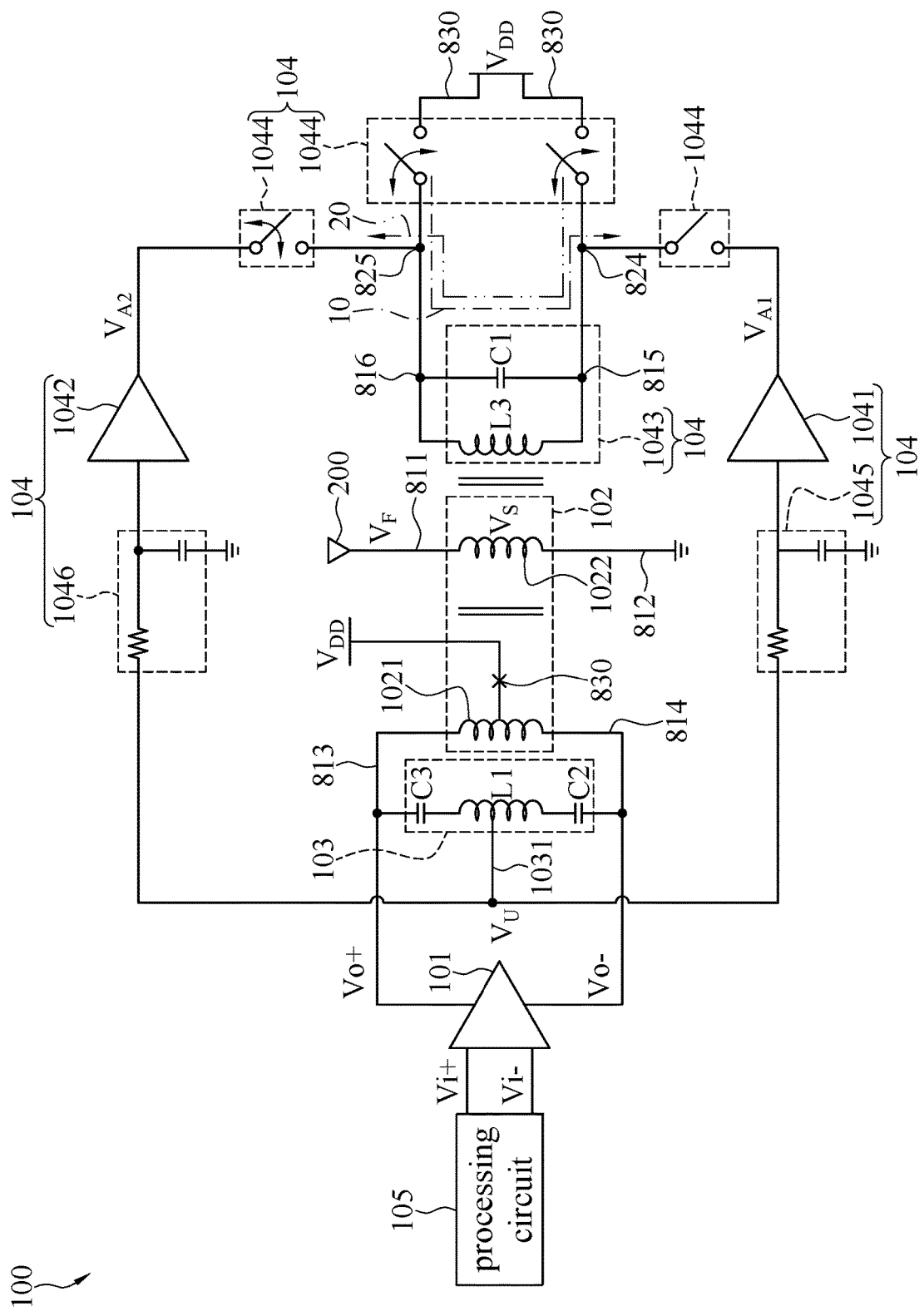
FIG. 5 illustrates a schematic block diagram of a radio frequency apparatus of a second embodiment of the present application.
Figure 6:
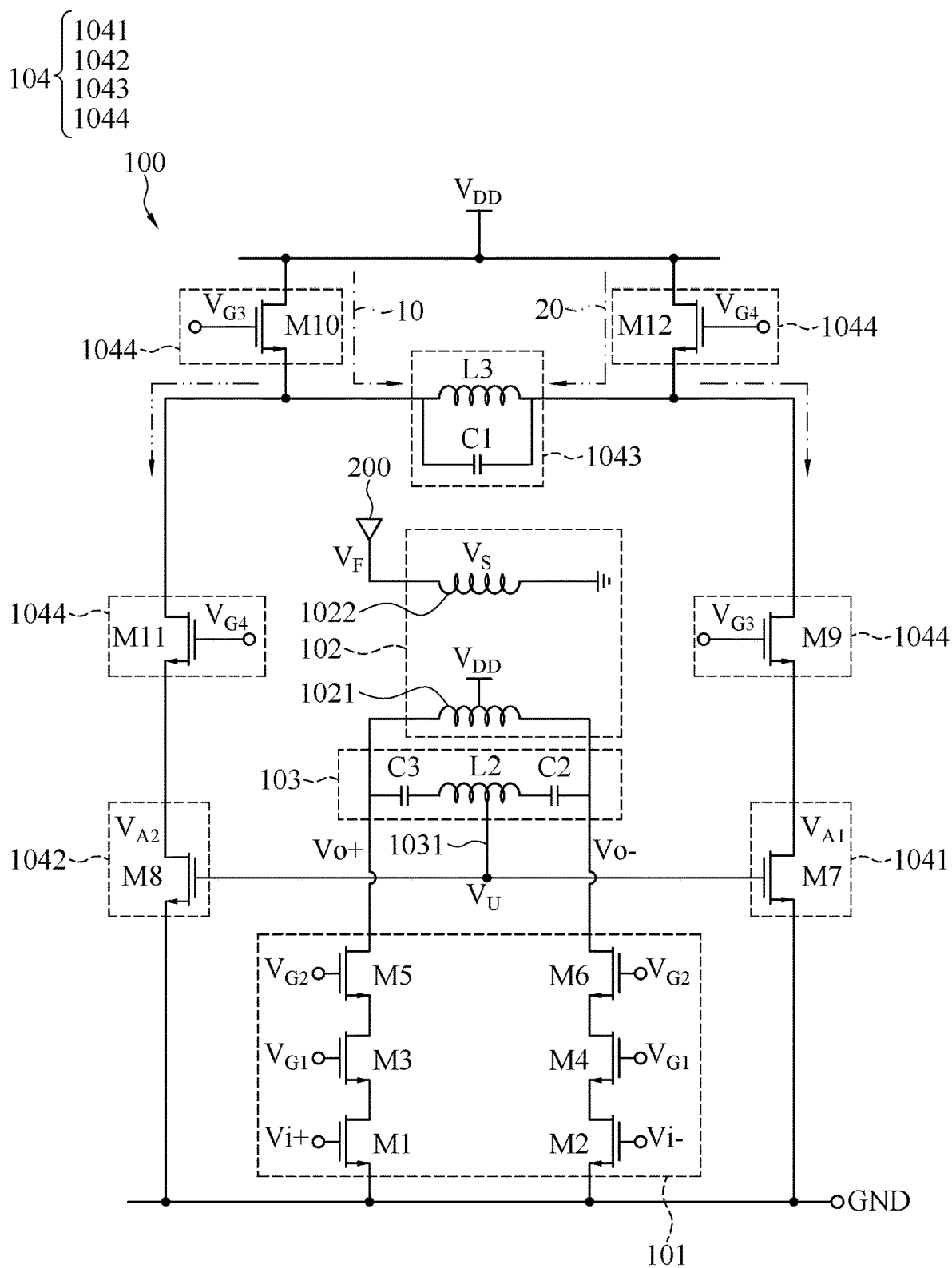
FIG. 6 illustrates a detailed circuit diagram of a part of the radio frequency apparatus of the second embodiment of the present application.

Refer to FIG. 5 and FIG. 6. FIG. 5 illustrates a schematic block diagram of a radio frequency apparatus 100 of a second embodiment of the present application. FIG. 6 illustrates a detailed circuit diagram of a part of the radio frequency apparatus 100 of the second embodiment of the present application. In some embodiments, the extraction circuit 103 not only obtains the to-be filtered signals Vo+ and Vo− through the primary side inductor 1021 of the signal coupling circuit 102, but also obtains the to-be filtered signals Vo+ and Vo− through coupling manner. For example, as shown in FIG. 5 and FIG. 6, the difference from the aforementioned first embodiment is that two terminals of the extraction circuit 103 in the second embodiment are further respectively coupled to two terminals of the primary side inductor 1021 of the signal coupling circuit 102 and two terminals of the power amplifier circuit 101, so as to obtain the to-be filtered signals Vo+ and Vo− from the primary side inductor 1021 or the power amplifier circuit 101.

In some embodiments, in addition to outputting the common mode signal $V_U$, the extraction circuit 103 can further provide a harmonic filtering function, and the frequency of the harmonics filtered by it can be different from the frequency of the harmonics filtered by the harmonic filter circuit 104. For example, a resonant frequency of the extraction circuit 103 is three times a fundamental frequency (the main operating frequency of the radio frequency apparatus 100) of the primary side inductor 1021, and the extraction circuit 103 performs third harmonic filtering on the to-be filtered signals Vo+ and Vo− according to the resonant frequency and the characteristics of passive elements in it, such that the filtered signal $V_F$ (or single-ended signal Vs) has no third harmonics. At this time, the harmonic filter circuit 104 can perform second harmonic filtering on the single-ended signal Vs, such that the filtered signal $V_F$ has no second harmonics. In this way, the radio frequency apparatus 100 can filter out multiple types of different frequencies of harmonics at the same time, such that the output signal merely has the fundamental frequency wave (or the output signal has precious few harmonics). For example, as shown in FIG. 5 and FIG. 6, the difference from the aforementioned first embodiment is that the extraction circuit 103 in the second embodiment includes two capacitors (a second capacitor C2 and a third capacitor C3 are used as an example) and a inductor L2. The inductor L2 is coupled between the second capacitor C2 and the third capacitor C3. By configuring the values of the inductor L2, the second capacitor C2 and the third capacitor C3, the aforementioned resonant frequency is formed. In other words, the resonant frequency formed by the inductor L2, the second capacitor C2 and the third capacitor C3 can be three times the fundamental frequency of the primary side inductor 1021. In some embodiments, the center tap 1031 of the extraction circuit 103 is located on the inductor L2 (specifically, on the center point of the inductor L2).

Figure 7:
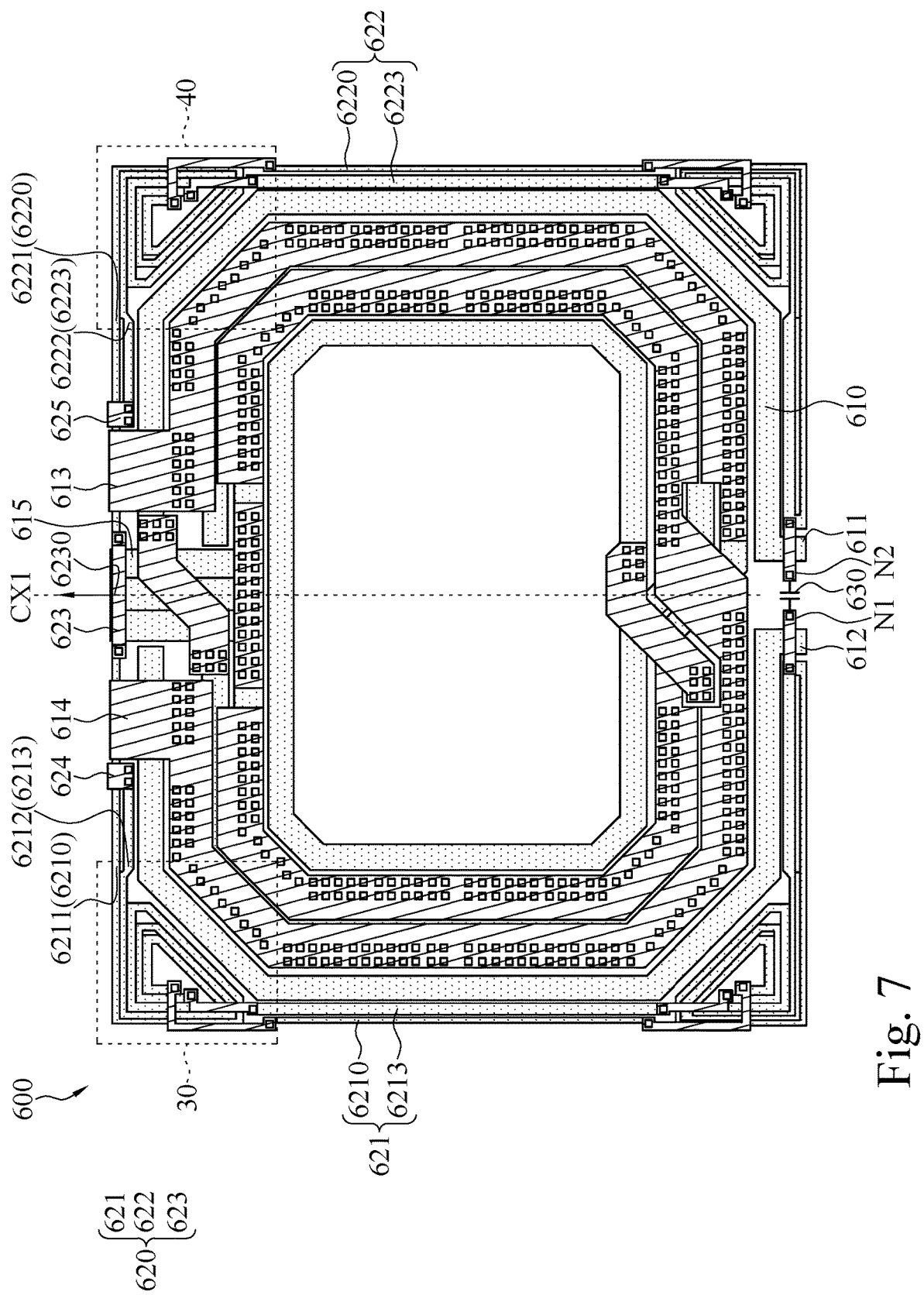
FIG. 7 illustrates a schematic diagram of an inductance device of a first embodiment of the present application.

Refer to FIG. 2 and FIG. 7. FIG. 7 illustrates a schematic diagram of an inductance device 600 of a first embodiment of the present application. Wherein, the inductance device 600 shown in FIG. 7 is corresponded to the signal coupling circuit 102, the extraction circuit 103 and the harmonic filter circuit 104 shown in FIG. 2. The inductance device 600 includes a first conductive layer pattern 610 in coiled, a second conductive layer pattern 620 in coiled and a capacitor (hereinafter referred to as a first capacitor 630). The first conductive layer pattern 610 forms the primary side inductor 1021 and the secondary side inductor 1022 of the signal coupling circuit 102. In detail, the first conductive layer pattern 610 has a first end 611, a second end 612, a third end 613, a fourth end 614 and a fifth end 615 respectively corresponding to the output terminal 811 of the signal coupling circuit 102, the secondary side ground terminal 812 of the signal coupling circuit 102, two input terminals 813 and 814 of the signal coupling circuit 102 and a feeding point 830 of the system voltage VDD.

The second conductive layer pattern 620 includes a first routing 621, a second routing 622 and a connecting component 623. One end of the first routing 621 is coupled to a first node N1. One end of the second routing 622 is coupled to a second node N2. The connecting component 623 is coupled between another end of the first routing 621 and another end of the second routing 622 and has a center tap 6230. Wherein, the center tap 6230 is corresponded to the center tap 1031 shown in FIG. 2. The first capacitor 630 is coupled between the first node N1 and the second node N2 to form the extraction circuit 103 and the resonant circuit 1043 of the harmonic filter circuit 104 with the second conductive layer pattern 620. Wherein, the first capacitor 630, the first node N1 and the second node N2 are respectively corresponded to the first capacitor C1 and two connecting terminal 815 and 816 thereof shown in FIG. 2, and the second conductive layer pattern 620 is corresponded to the inductor L1 and the inductor L3 shown in FIG. 2. The first conductive layer pattern 610 and the second conductive layer pattern 620 are arranged with respect to a central axis CX1 in a symmetrical state, and the center tap 6230 is located on the central axis CX1. By this way, a structural symmetry of the inductance device 600 is increased. In some embodiments, the second conductive layer pattern 620 is located on the outer side (or referred to as the periphery) of the first conductive layer pattern 610.

In some embodiments, as shown in FIG. 7, the first routing 621 includes a first sub-routing 6210 and a second sub-routing 6213. One end of the first sub-routing 6210 (hereinafter referred to as a second end of the first sub-routing 6210) and one end of the second sub-routing 6213 (hereinafter referred to as a second end of the second sub-routing 6213) are coupled to the first node N1. The second routing 622 includes a third sub-routing 6220 and a fourth sub-routing 6223. One end of the forth sub-routing 6223 (hereinafter referred to as a second end of the forth sub-routing 6223) and one end of the third sub-routing 6220 (hereinafter referred to as a second end of the third sub-routing 6220) are coupled to the second node N2.

Figure 8:
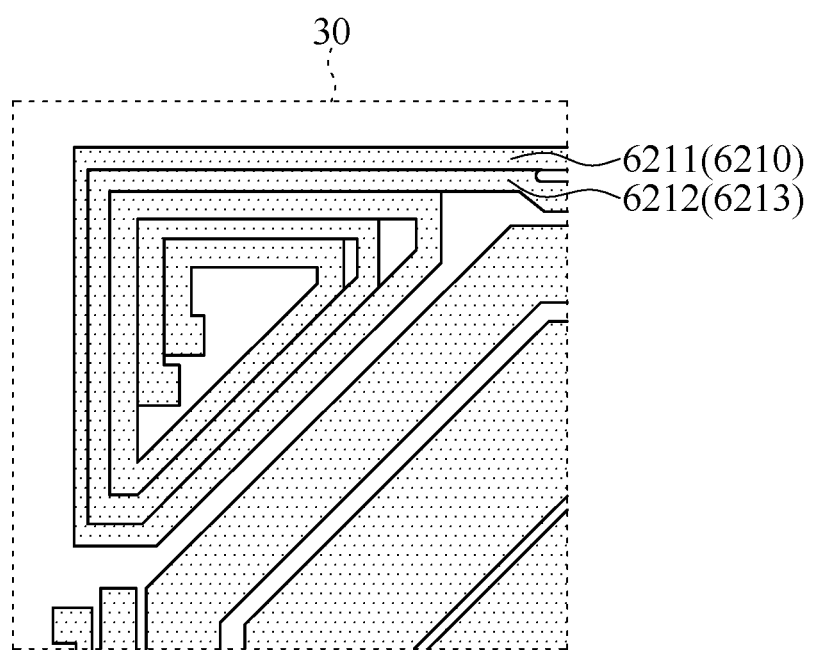
FIG. 8 illustrates a schematic diagram of a partial structure of inductance device according to some embodiments of the present application.

Refer to FIG. 8. FIG. 8 illustrates a schematic diagram of a partial structure 30 of inductance device 600 according to some embodiments of the present application. The first sub-routing 6210 includes a plurality of first coils 6211. The second sub-routing 6213 includes a plurality of second coils 6212. The first coils 6211 and the second coils 6212 are arranged in interval. For example, the first coil 6211 is arranged by the first sub-routing 6210 in coiled, and the second coil 6212 is arranged by the second sub-routing 6213 in coiled. The first coils 6211 and the second coils 6212 are arranged in interval with each other. For example, an arrangement order is as follows: "first coil 6211, second coil 6212, first coil 6211, second coil 6212 . . . , and so on". Refer to FIG. 7 in combination, the first coils 6211 and the second coils 6212 are located in the partial structure 30, and the partial structure 30 is located on the outer side (or referred to as the periphery) of the first conductive layer pattern 610.

Similarly, refer to a partial structure 40 in the upper right corner of FIG. 7. The third sub-routing 6220 includes a plurality of third coils 6221, and the fourth sub-routing 6223 includes a plurality of fourth coils 6222. The coupling manner and the arrangement manner of the third coils 6221 and the fourth coils 6222 are the same as those of the first coils 6211 and the second coils 6212. In order to keep the disclosure of the present application concise, it will not be described in detail.

What needs to be explained is that the lower left corner and the lower right corner of the inductance device 600 in FIG. 7 have related structures similar to the partial structure 30 and the partial structure 40. Similarly, the coupling manner and the arrangement manner of them are the same as those of the first coils 6211 and the second coils 6212. In order to keep the disclosure of the present application concise, it will not be described in detail.

In some embodiments, the connecting component 623 is coupled between another end of the first sub-routing 6210 (hereinafter referred to as a first end of the first sub-routing 6210) and another end of the third sub-routing 6220 (hereinafter referred to as a first end of the third sub-routing 6220), and another end of the second sub-routing 6213 (hereinafter referred to as a first end 624 of the second sub-routing 6213) and another end of the fourth sub-routing 6223 (hereinafter referred to as a first end 625 of the fourth sub-routing 6223) are respectively coupled to the first amplifier circuit 1041 and the second amplifier circuit 1042 of the harmonic filter circuit 104. That is, the first end 624 of the second sub-routing 6213 is corresponded to a feeding point 824 of the first amplified signal $V_{A1}$ of the first amplifier circuit 1041, and the first end 625 of the fourth sub-routing 6223 is corresponded to a feeding point 825 of the second amplified signal $V_{A2}$ of the second amplifier circuit 1042.

For example, the first sub-routing 6210, the second sub-routing 6213, the third sub-routing 6220 and the fourth sub-routing 6223 all include a first end and a second end. As shown in FIG. 7, the second end (such as lower end) of the first sub-routing 6210 and the second end (such as lower end) of the second sub-routing 6213 are coupled to the first node N1. The second end (such as lower end) of the third sub-routing 6220 and the second end (such as lower end) of the fourth sub-routing 6223 are coupled to the second node N2. The first ends of the first sub-routing 6210 and the third sub-routing 6220 are located on the upper side in the figure, the first end of the first sub-routing 6210 is coupled to one terminal of the connecting component 623, and another terminal of the connecting component 623 is coupled to the first end of the third sub-routing 6220. The first end of the first sub-routing 6210 is wound toward the left side in the figure, and then the first sub-routing 6210 is wound down along the left side. Furthermore, after winding to the lower left side in the figure, it is wound toward the first node N1 in the lower side in the figure, and the second end of the first sub-routing 6210 is finally coupled to the first node N1. Similarly, the first end of the third sub-routing 6220 is wound toward the right side in the figure, and then the third sub-routing 6220 is wound down along the right side. Furthermore, after winding to the lower right side in the figure, it is wound toward the second node N2 in the lower side in the figure, and the second end of the third sub-routing 6220 is finally coupled to the second node N2.

At the first node N1, the second end of the second sub-routing 6213 is coupled to the first node N1. The second end of the second sub-routing 6213 is wound toward the left side in the figure, and then the second sub-routing 6213 is wound up along the left side. Furthermore, after winding to the upper left in the figure, it is wound toward the connecting component 623 on the upper side in the figure, and wound to the first end 624 of the second sub-routing 6213 on the upper side in the figure to be coupled to the first amplifier circuit 1041. Similarly, at the second node N2, the second end of the fourth sub-routing 6223 is coupled to the second node N2. The second end of the fourth sub-routing 6223 is wound toward the right side in the figure, and then the fourth sub-routing 6223 is wound up along the right side. Furthermore, after winding to the upper right in the figure, it is wound toward the connecting component 623 on the upper side in the figure, and wound to the first end 625 of the fourth sub-routing 6223 on the upper side in the figure to be coupled to the second amplifier circuit 1042. It can be seen from the aforementioned structural configuration that the first sub-routing 6210, the second sub-routing 6213, the third sub-routing 6220 and the fourth sub-routing 6223 form a folded inductor.

Figure 9:
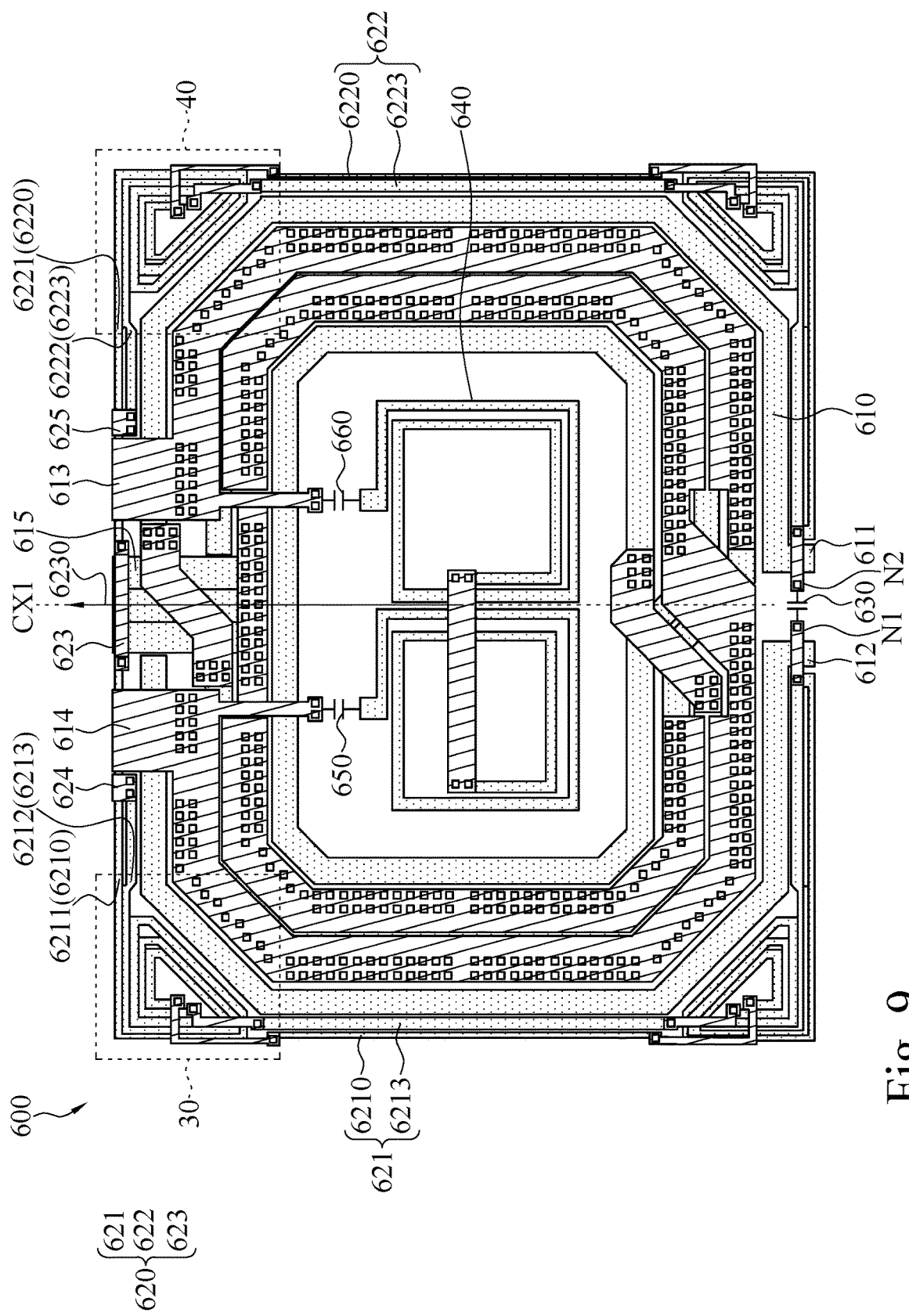
FIG. 9 illustrates a schematic diagram of an inductance device of a second embodiment of the present application.

Refer to FIG. 5 and FIG. 9. FIG. 9 illustrates a schematic diagram of an inductance device 600 of a second embodiment of the present application. Wherein, the inductance device 600 shown in FIG. 9 is corresponded to the signal coupling circuit 102, the extraction circuit 103 and the harmonic filter circuit 104 shown in FIG. 5. The difference from the aforementioned first embodiment is that the inductance device 600 in the second embodiment further includes a third conductive layer pattern 640 in coiled, the second conductive layer pattern 620 forms the resonant circuit 1043 of the harmonic filter circuit 104, and two ends of the third conductive layer pattern 640 are respectively coupled to a second capacitor 650 and a third capacitor 660 to form the extraction circuit 103. Specifically, the third conductive layer pattern 640 is coupled between the second capacitor 650 and the third capacitor 660. The center tap 6230 is disposed at the third conductive layer pattern 640. Wherein, the center tap 6230 is corresponded to the center tap 1031 shown in FIG. 5. Wherein, the second capacitor 650 and the third capacitor 660 are respectively corresponded to the second capacitor C2 and the third capacitor C3 shown in FIG. 5, the third conductive layer pattern 640 is corresponded to the inductor L2 shown in FIG. 5, and the second conductive layer pattern 620 is corresponded to the inductor L3 shown in FIG. 5. The first conductive layer pattern 610, the second conductive layer pattern 620 and the third conductive layer pattern 640 are arranged with respect to the central axis CX1 in a symmetrical state. In this way, the structural symmetry of the inductance device 600 is increased. In some embodiments, the third conductive layer pattern 640 is located on inner side of the first conductive layer pattern 610. In this way, the required circuit placement space is reduced.

In some embodiments, the inductance device 600 is disposed on a substrate (not shown). The substrate may has a multilayer structure, and at least one of the first conductive layer pattern 610, the second conductive layer pattern 620 and the third conductive layer pattern 640 may be disposed across different layers of the multilayer structure to form the signal coupling circuit 102, the extraction circuit 103 and the harmonic filter circuit 104.

Figure 10:
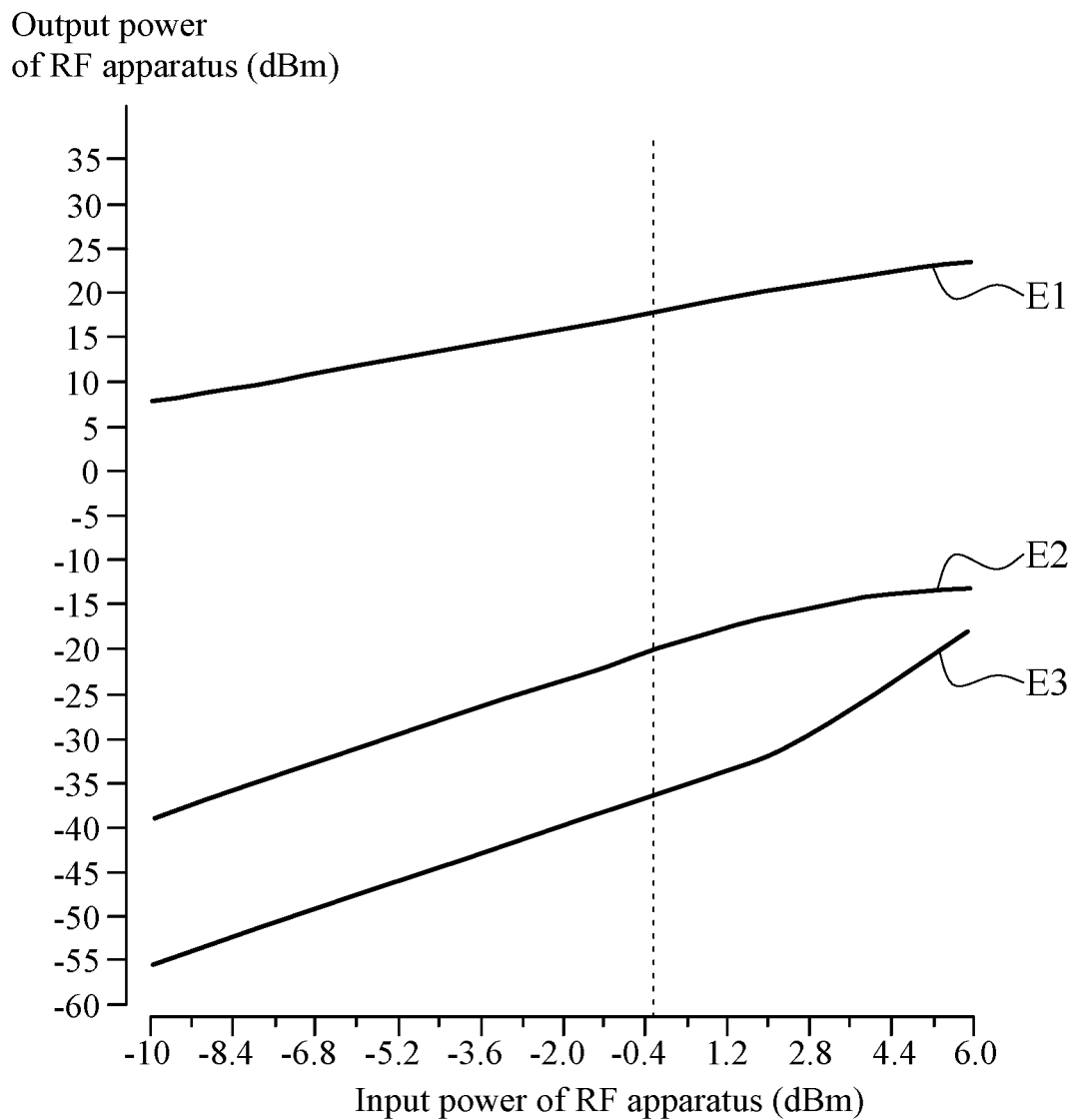
FIG. 10 illustrates a schematic diagram of the experimental data of radio frequency apparatus according to some embodiments of the present application and a comparative example.

Refer to FIG. 10. FIG. 10 illustrates a schematic diagram of the experimental data of radio frequency apparatus 100 according to some embodiments of the present application and a comparative example. In the comparative example, it performs no harmonic filtering on the output signal (e.g., radio frequency signal). The experimental curves of the power response parameter (such as the power response between the input power and the output power of the radio frequency apparatus 100) is E1, E2 and E3. The input power of the radio frequency apparatus 100 is the input power of the power amplifier circuit 101, the output power of the radio frequency apparatus 100 is the output power of the signal coupling circuit 102. Curve E1 is a fundamental frequency wave of the output signal (e.g., radio frequency signal) of the radio frequency apparatus 100 according to some embodiments of the present application and the comparative example, curve E2 is the power response of harmonics of the output signal of the comparative example, and curve E3 is the power response of harmonics of the output signal of the radio frequency apparatus 100 according to some embodiments of the present application. It can be seen that the power of the harmonics shown in the embodiments of the present application is lower than the power of the harmonics of the comparative example. Therefore, the harmonics of output signal can be reduced if the radio frequency apparatus 100 of the embodiments of the present application is adopted.

In sum, according to some embodiments of the present application, the radio frequency apparatus and the inductance device thereof eliminate harmonic through a signal with the same frequency as the harmonic and with the phase inverse to the harmonic, so as to reduce the harmonic of output signal without affecting the fundamental frequency of the output signal, and further to reduce the undesirable effects of the radio frequency apparatus and the inductance device thereof on other circuits (such as devices operating at other frequency bands). In some embodiments, the harmonic filter for filtering harmonics is disposed inside the radio frequency apparatus and the inductance device thereof. Therefore, it reduces the exposure to some external interference factors, and it can avoid affecting the performance of the circuit itself in the radio frequency apparatus or avoid increasing additional costs.

What is claimed is:

1. A radio frequency apparatus, comprising:
    a power amplifier circuit, configured to amplify a differential signal to output a to-be-filtered signal;
    a signal coupling circuit, comprising a primary side inductor and a secondary side inductor, the signal coupling circuit is configured to receive the to-be-filtered signal through the primary side inductor and to output a single-ended signal from the secondary side inductor;
    an extraction circuit, having a center tap, the extraction circuit is configured to be inductively coupled with the primary side inductor and to output a common mode signal from the center tap; and
    a harmonic filter circuit, configured to perform a harmonic filtering on the single-ended signal according to the common mode signal, such that the secondary side inductor of the signal coupling circuit outputs a filtered signal.

2. The radio frequency apparatus according to claim 1, wherein the harmonic filter circuit comprises:
    a first amplifier circuit, configured to amplify the common mode signal under a first phase to output a first amplified signal;
    a second amplifier circuit, configured to amplify the common mode signal under a second phase to output a second amplified signal; and
    a resonant circuit, configured to couple, according to the first amplified signal, the single-ended signal when the common mode signal is under the first phase, and to couple, according to the second amplified signal, the single-ended signal when the common mode signal is under the second phase, so as to perform the harmonic filtering on the single-ended signal.

3. The radio frequency apparatus according to claim 2, wherein the first phase and the second phase are inverse to each other.

4. The radio frequency apparatus according to claim 2, wherein the harmonic filter circuit further comprises a switching circuit which is coupled between the first amplifier circuit, the second amplifier circuit and the resonant circuit, so as to conduct a coupling between the first amplifier circuit and the resonant circuit when the common mode signal is under the first phase, and to conduct a coupling between the second amplifier circuit and the resonant circuit when the common mode signal is under the second phase.

5. The radio frequency apparatus according to claim 2, wherein the harmonic filter circuit further comprises two matching circuits which are respectively coupled between the center tap and the first amplifier circuit and coupled between the center tap and the second amplifier circuit, and are configured to respectively perform a phase and impedance matching on the common mode signal under the first phase and on the common mode signal under the second phase, so as to output the common mode signal matched in phase and impedance to the first amplifier circuit and the second amplifier circuit.

6. The radio frequency apparatus according to claim 2, wherein the extraction circuit is an inductor, two terminals of the inductor are coupled to the resonant circuit, and a resonant frequency formed by the inductor and the resonant circuit is twice a fundamental frequency of the primary side inductor.

7. The radio frequency apparatus according to claim 6, wherein the inductor and the resonant circuit form an inductor-capacitor parallel resonant circuit (L-C parallel resonant circuit).

8. The radio frequency apparatus according to claim 1, wherein a resonant frequency of the extraction circuit is three times a fundamental frequency of the primary side inductor.

9. The radio frequency apparatus according to claim 8, wherein two terminals of the extraction circuit are coupled to the primary side inductor, the extraction circuit comprises two capacitors and an inductor, the inductor is coupled between the two capacitors, and the resonant frequency formed by the inductor and the two capacitors is three times the fundamental frequency of the primary side inductor.

10. An inductance device, comprising:
a first conductive layer pattern being coiled, configured to form a primary side inductor and a secondary side inductor of a signal coupling circuit, wherein the signal coupling circuit is configured to convert a to-be-filtered signal from the primary side inductor to a single-ended signal of the secondary side inductor;
a second conductive layer pattern being coiled, comprising:
a first routing with one end coupled to a first node;
a second routing with one end coupled to a second node; and
a connecting component, coupled between another end of the first routing and another end of the second routing and having a center tap, wherein the first conductive layer pattern and the second conductive layer pattern are arranged with respect to a central axis in a symmetrical state, and the center tap is located on the central axis; and
a capacitor, coupled between the first node and the second node to form an extraction circuit and a resonant circuit of a harmonic filter circuit with the second conductive layer pattern, the extraction circuit is configured to be coupled with the primary side inductor and to output a common mode signal from the center tap, and the harmonic filter circuit is configured to perform a harmonic filtering on the single-ended signal according to the common mode signal, such that the secondary side inductor of the signal coupling circuit outputs a filtered signal.

11. The inductance device according to claim 10, wherein the second conductive layer pattern is located on outer side of the first conductive layer pattern.

12. The inductance device according to claim 10, wherein a resonant frequency formed by the extraction circuit and the resonant circuit is twice a fundamental frequency of the primary side inductor.

13. The inductance device according to claim 10, wherein the first routing comprises:
a first sub-routing, comprising a plurality of first coils; and
a second sub-routing, comprising a plurality of second coils, one end of the second sub-routing and one end of the first sub-routing are coupled to the first node, wherein the plurality of first coils and the plurality of second coils are arranged in interval; and
the second routing comprises:
a third sub-routing, comprising a plurality of third coils; and
a fourth sub-routing, comprising a plurality of fourth coils, one end of the fourth sub-routing and one end of the third sub-routing are coupled to the second node, wherein the plurality of third coils and the plurality of fourth coils are arranged in interval.

14. The inductance device according to claim 13, wherein the connecting component is coupled between another end of the first sub-routing and another end of the third sub-routing, and another end of the second sub-routing and another end of the fourth sub-routing are respectively coupled to a first amplifier circuit and a second amplifier circuit of the harmonic filter circuit.

15. An inductance device, comprising:
a first conductive layer pattern being coiled, configured to form a primary side inductor and a secondary side inductor of a signal coupling circuit, wherein the signal coupling circuit is configured to convert a to-be-filtered signal from the primary side inductor to a single-ended signal of the secondary side inductor;
a second conductive layer pattern being coiled, configured to form a resonant circuit of a harmonic filter circuit, wherein the second conductive layer pattern comprises:
a first routing with one end coupled to a first node;
a second routing with one end coupled to a second node; and
a connecting component, coupled between another end of the first routing and another end of the second routing;
a first capacitor, coupled between the first node and the second node; and
a third conductive layer pattern being coiled, having a center tap, two ends of the third conductive layer pattern are respectively coupled to a second capacitor and a third capacitor to form an extraction circuit, wherein the first conductive layer pattern, the second conductive layer pattern and the third conductive layer pattern are arranged with respect to a central axis in a symmetrical state, the center tap is located on the central axis, the extraction circuit is configured to couple with the primary side inductor and to output a common mode signal from the center tap, and the harmonic filter circuit is configured to perform a harmonic filtering on the single-ended signal according to the common mode signal, such that the secondary side inductor of the signal coupling circuit outputs a filtered signal.

16. The inductance device according to claim 15, wherein the second conductive layer pattern is located on outer side of the first conductive layer pattern.

17. The inductance device according to claim 15, wherein the third conductive layer pattern is located on inner side of the first conductive layer pattern.

18. The inductance device according to claim 15, wherein a resonant frequency of the extraction circuit is three times a fundamental frequency of the primary side inductor.

19. The inductance device according to claim 15, wherein the first routing comprises:
a first sub-routing, comprising a plurality of first coils; and a second sub-routing, comprising a plurality of second coils, one end of the second sub-routing and one end of the first sub-routing are coupled to the first node, wherein the plurality of first coils and the plurality of second coils are arranged in interval; and the second routing comprises:
a third sub-routing, comprising a plurality of third coils; and
a fourth sub-routing, comprising a plurality of fourth coils, one end of the fourth sub-routing and one end of the third sub-routing are coupled to the second node, wherein the plurality of third coils and the plurality of fourth coils are arranged in interval.

20. The inductance device according to claim 19, wherein the connecting component is coupled between another end of the first sub-routing and another end of the third sub-routing, and another end of the second sub-routing and another end of the fourth sub-routing are respectively coupled to a first amplifier circuit and a second amplifier circuit of the harmonic filter circuit.

\* \* \* \* \*